United States Patent
Hutchinson et al.

(10) Patent No.: US 6,912,127 B2
(45) Date of Patent: Jun. 28, 2005

(54) SYSTEM FOR VIBRATION DAMPENING

(75) Inventors: David Frederick Hutchinson, Round Rock, TX (US); Ahmed Mohiuddin, Austin, TX (US)

(73) Assignee: Dell Products L.P., Round Rock, TX (US)

(*) Notice: Subject to any disclaimer, the term of this patent is extended or adjusted under 35 U.S.C. 154(b) by 0 days.

(21) Appl. No.: 10/152,594

(22) Filed: May 21, 2002

(65) Prior Publication Data

US 2003/0218863 A1 Nov. 27, 2003

(51) Int. Cl.[7] .............................................. H05K 7/20
(52) U.S. Cl. ..................... 361/695; 361/694; 248/633; 165/121
(58) Field of Search ...................... 361/703, 707–720, 361/695, 697, 681, 694, 687; 257/722; 248/633, 634; 165/80.3, 121–126; 454/184; 312/236; 415/213.1, 178, 214.1, 223, 211.1; 417/354, 423.7, 423.14; 24/457, 458, 297, 453

(56) References Cited

U.S. PATENT DOCUMENTS

| | | | | |
|---|---|---|---|---|
| 3,748,997 A | * | 7/1973 | Dean, Jr. et al. | 454/234 |
| 4,926,291 A | * | 5/1990 | Sarraf | 361/685 |
| 5,208,730 A | * | 5/1993 | Tracy | 361/687 |
| 5,751,549 A | * | 5/1998 | Eberhardt et al. | 361/687 |
| 5,963,424 A | * | 10/1999 | Hileman et al. | 361/695 |
| 5,979,541 A | | 11/1999 | Saito | 165/80.3 |
| 6,115,251 A | | 9/2000 | Patel et al. | 361/699 |
| 6,269,001 B1 | * | 7/2001 | Matteson et al. | 361/695 |
| 6,324,731 B1 | * | 12/2001 | Pliml, Jr. | 24/453 |
| 6,351,380 B1 | | 2/2002 | Curlee et al. | 361/695 |
| 6,549,404 B1 | * | 4/2003 | Kitahara et al. | 361/695 |
| 6,597,972 B2 | * | 7/2003 | Emberty et al. | 700/304 |
| 6,600,648 B2 | | 7/2003 | Curlee et al. | 361/685 |
| 2002/0051338 A1 | * | 5/2002 | Jiang et al. | |

* cited by examiner

Primary Examiner—Anatoly Vortman
(74) Attorney, Agent, or Firm—Hamilton & Terrile, LLP; Robert W. Holland

(57) ABSTRACT

A method and system dampens vibrations associated with a device installed in a system by supporting the device with one or more support members having a rigid support portion and a dampening support portion made from an elastic material. In one embodiment, an information handling system fan assembly is made with two shot injection molding to form a support member with an integrated dampener that holds a fan mount disposed in a cooling air channel defined by a fan housing. The fan housing, mount and rigid portion of the support member are formed with one shot from a substantially rigid material and the dampening portion is formed with another shot from a substantially elastic material. A fan couples to the fan mount for installation in the information handling system.

13 Claims, 3 Drawing Sheets

SYSTEM FOR VIBRATION DAMPENING

BACKGROUND OF THE INVENTION

1. Field of the Invention

The present invention relates in general to the field of dampening vibrations, and more particularly to a method and system for information handling system cooling fan vibration dampening.

2. Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems having played an important role in improving worker and individual productivity by automating tasks and performing complex computations. For instance, information handling systems commonly perform day-to-day operations in banks, libraries, research facilities, homes and other locations where workers and individuals spend significant amounts of time in quiet thought to accomplish complex tasks. Information handling systems assist by quietly tracking financial transactions and inventory, by acting as word processors that record research results or by connecting to networks to transfer valuable information on a timely basis. Under a number of circumstances in which information handling systems operate, quiet operation is an important consideration for users.

One difficulty with keeping information handling system operations as quiet as possible is that the electronic components that perform or support information handling tend to generate heat that typically must be removed by cooling fans in order to ensure proper operation. Cooling fans often represent the greatest noise producing component of an information handling system. As information handling systems have grown more powerful with greater power consumption and faster operating speeds, the need for cooling has increased, leading to the use of more powerful cooling fans that operate at higher speeds and for greater time periods. To reduce the vibration and related noise of cooling fans, cooling fans are typically installed into information handling systems with vibration dampers, such as elastic washers or grommets that absorb vibrations, such as rubber inserts. However, these vibration dampening pieces increase the complexity of manufacturing information handling systems since they are often small pieces that are manually installed with cooling fans.

SUMMARY OF THE INVENTION

Therefore a need has arisen for a method and system which dampens vibrations of system components to decrease system noise.

A further need exists for a method and system which incorporates vibration dampening for a system component without substantially increasing the complexity of assembling the component in the system.

In accordance with the present invention, a method and system are provided which substantially reduces the disadvantages and problems associated with previous methods and systems for dampening vibration noise of a system component. Two shot injection molding of the component support integrates rigid and dampening portions that install the component in the system with vibration dampening.

More specifically, an information handling system cooling fan assembly is molded as a single piece that includes a dampening portion to dampen vibrations generated through cooling fan operation. The cooling fan housing defines a cooling air channel for the cooling fan to pass cooling air through in order to cool heat-generating components of the information handling system. A cooling fan mount is disposed in the cooling air channel to support the cooling fan. Cooling fan mount supports couple to the housing and the cooling fan mount to hold the cooling fan mount in the cooling air channel. The cooling fan mount support has a rigid portion formed by a substantially rigid material and a dampening portion formed by a vibration-absorbing material, such as an elastomer. A cooling fan couples to the cooling fan mount and the housing couples to an information handling system to align cooling air flow to remove heat from heat-generating components.

In one embodiment, the cooling fan housing, mount and mount supports are formed as a single, integrated piece with a two shot plastic injection. A substantially rigid plastic is injected in one shot to form the cooling fan housing, mount and rigid portion of the mount supports. An elastic plastic is injected in another shot to form the dampening portion of the cooling fan mount support. For instance, the elastic material is injected into a gap left during formation of the cooling fan mount support. The two shot injection molding process produces a single fan assembly piece with the vibration-absorbing elastic portion of the mount support integrated with the rigid portion. Thus, assembly of the information handling system involves coupling the fan to the mount support and the housing to the information handling system without separate vibration absorbing grommets or pieces.

The present invention provides a number of important technical advantages. One example of an important technical advantage is that vibration dampening provided for a component decreases the noise associated with operation of the component. For instance, a cooling fan operates in an information handling system with vibrations isolated by an elastomer vibration dampening portion of the cooling fan support, while a rigid portion holds the fan securely in position. The information handling system operates quietly, providing an environment more conducive to concentration by information handling system users.

Another example of an important technical advantage of the present invention is that information handling system assembly is simplified. For instance, the use of two shot plastic injection to form a single integrated piece having a rigid portion and an elastic portion provides reduced assembly steps for installing a fan assembly into an information handling system. The integrated vibration dampening section eliminates or reduces the need for assembling additional vibration absorbing grommets or other devices, thus reducing manual labor used during information handling system assembly.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Information handling systems are often used in noise-sensitive environments so that quiet operation is an important design consideration. The use of a cooling fan assembly with integrated vibration dampening aids in reducing the noise and vibration put out by an information handling system. For purposes of this application, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
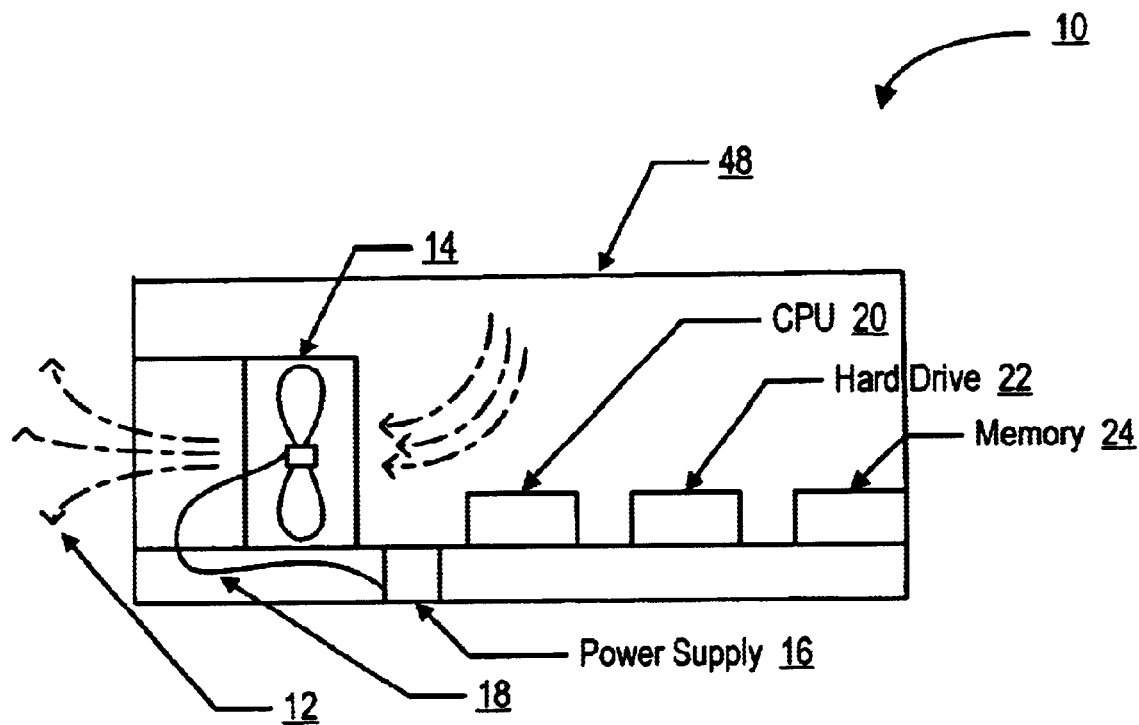
FIG. 1 depicts a side view of a block diagram of an information handling system.

Referring now to FIG. 1, a side cutaway view of an information handling system 10 is depicted with a cooling air flow provided through housing 48 by a cooling fan 14. Information handling system 10 includes electronic components that generate heat. If heat-generating components are not cooled, such as with a cooling air flow, failure of the heat-generating or other heat sensitive components may occur. One primary source of heat generation is a power supply 16, which typically accepts external AC power and transforms the AC power into DC power of predetermined voltages for use by information handling system electronic components. Power supply 16 provides power to cooling fan 14 through a power line 18. Another primary heat generating component is a CPU 20 which performs computations to support information handling functions. Typically, the faster a CPU operates, the more heat it generates and the more specialized and critical the transfer of heat from the CPU becomes. Thus, powerful CPUs generally depend on strong cooling air flow for proper operation. Other heat-generation components depicted in information handling system 10 include a hard drive 22 and memory 24. In other embodiments, a variety of electronic components may be included that also generate heat, such as system control and graphics processors.

Figure 2:
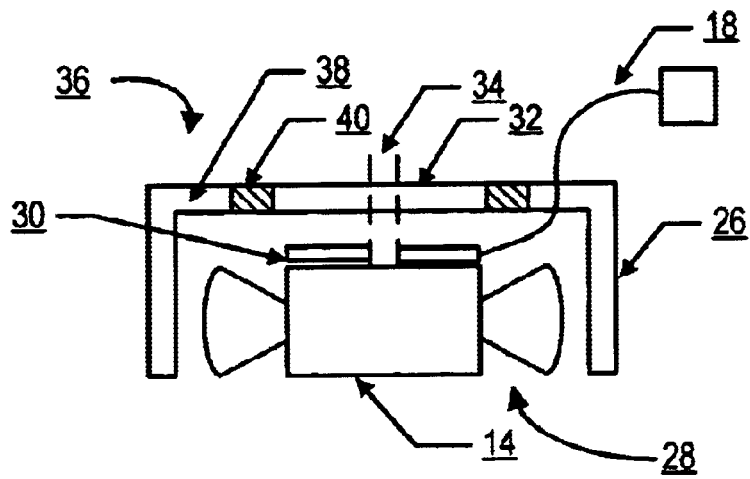
FIG. 2 depicts a side cutaway view of a cooling fan mounted with supports having integrated dampeners.
Figure 3:
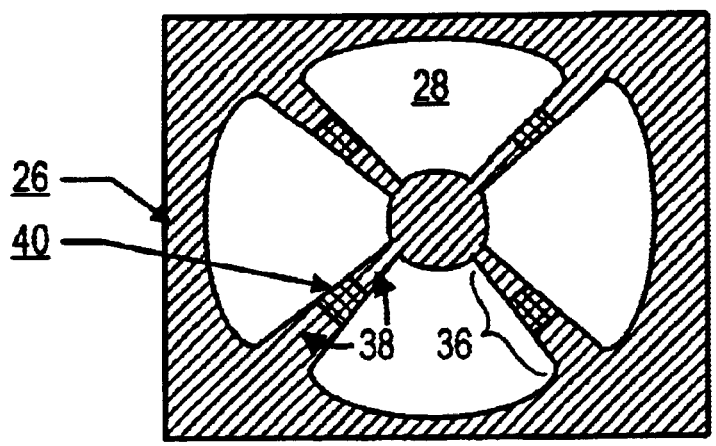
FIG. 3 depicts a top view of a cooling fan assembly with a cooling fan mount supported by dampener members.

Referring now to FIG. 2, a side cutaway view of a cooling fan assembly is depicted with integrated vibration dampening. A cooling fan housing 26 defines a cooling air channel 28 through which cooling fan 14 draws or pushes a cooling air flow. Power line 18 provides power to operate cooling fan 14 through a controller 30. Controller 30 varies cooling fan operation to adjust the strength of the cooling air flow as needed to maintain a predetermined temperature range within information handling system 10. Cooling fan 14 and controller 30 are mounted to a cooling fan mount 32 with a pin 34. Cooling fan mount 32 is held disposed in cooling air channel 28 by support members 36 that have a generally rigid portion 38 and an elastic dampener portion 40. Support member 36 couples to cooling fan mount 32 and cooling fan housing 26 to firmly support a cooling fan 14 within cooling air channel 28. FIG. 3 depicts a top view that illustrates the opening provided for cooling air channel 28 to provide a passage for cooling air flow between housing 26 and cooling fan mount 32. Support members 36 act as impeller struts that hold cooling fan mount 32 in place without substantially blocking the cooling air flow.

In one embodiment, support members 36 are integrated with cooling fan mount 32 and housing 26 as a single piece by forming the piece with two shot plastic injection. One shot of the two shot plastic injection forms cooling fan housing 26, cooling fan mount 32 and rigid portions 38 of support member 36 with a substantially rigid plastic material. Another shot of the two shot plastic injection forms dampener portions 40 of support member 36 with an elastic material that absorbs vibrations associated with operation of cooling fan 14. The two shot plastic injection integrates the rigid and elastic portions of support member 36 into a single piece that both firmly couples cooling fan mount 32 to cooling fan housing 26 and absorbs vibrations from a cooling fan coupled to cooling fan mount 32. In alternative embodiments, additional dampening portions may be included at various positions of the fan assembly to provide dampening as needed, such as at the point of attachment of housing 26 to information handling system 10. An example of a plastic material for the formation of the rigid portions of support member 36 is glass filled polyester. For instance, rigid portion of support member 36 is formed with 15% glass and housing 26 is formed with 30% glass. Two examples of elastic materials are Polyone Synprene IT37-031and APA Alcryn 2060 BK. Alternative materials may be selected to achieve desired strength and vibration dampening.

Figure 4:
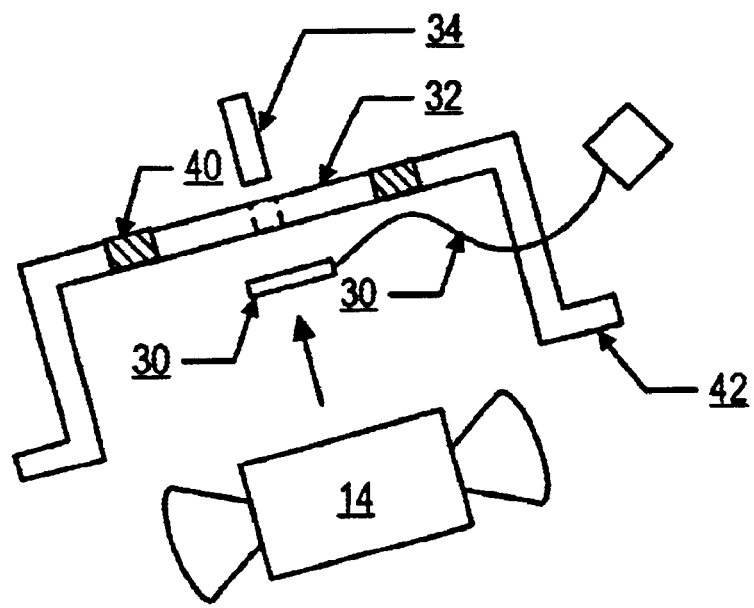
FIG. 4 depicts assembly of a cooling fan to a cooling fan housing formed by two shot injection with rigid and elastic materials.

Referring now to FIG. 4, a blow-up side view of an assembly of a fan 14 into a housing 26 illustrates the reduced complexity provided by an integrated support member dampener 40. Fan 14 and controller 30 couple to support mount 32 with pin 34 in essentially a single step. Cooling fan housing 26 is then installed by coupling an attachment point 42 to an information handling system housing. With vibration dampening for cooling fan 14 provided by dampening portion 40 of support members 36, the need to couple cooling fan housing 26 to information handling system 10 with vibration dampening devices, such as elastic rubber grommets, is substantially reduced or eliminated. If additional vibration dampening needs arise, the dampening material may be added at other points of the fan assembly, such as attachment point 42. Thus, the assembly process for installing a fan 14 into an information handling system 10 involves a reduced number of steps, reducing labor costs and part inventory management needs.

Figure 5:
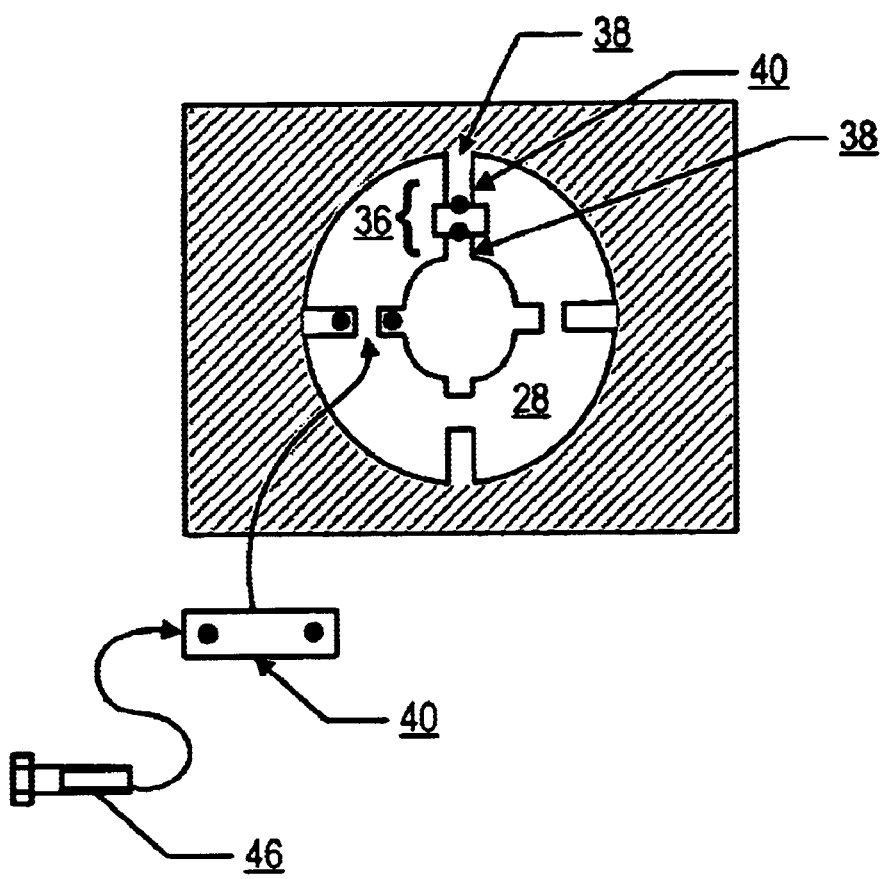
FIG. 5 depicts a top view of a cooling fan mount coupled to a cooling fan housing with dampener support members.

In another embodiment depicted by FIG. 5, dampening portion 40 of support member 36 is assembled as a separate piece. An attachment device 46, such as a screw or a clip, secures dampening portion 40 to rigid portions 38 integrated with mount support 32 and housing 26. Although the embodiment depicted by FIG. 5 involves additional steps to install when compared with the two shot injection integrated assembly, the installation of elastic portion 40 as a support member allows preassembly of a cooling fan assembly complete with vibration dampening before installation of the cooling fan assembly into an information handling system 10. Preassembly reduces the complexity of installation by allowing handling of the fan assembly as a separate unit before installation of vibration dampening, as opposed to dampening grommets used with installation of fan housing 26, which requires more awkward handling of the information handling system.

Although the present invention has been described in detail, it should be understood that various changes, substitutions and alterations can be made hereto without departing from the spirit and scope of the invention as defined by the appended claims.

What is claimed is:

1. An information handling system cooling fan assembly comprising:
    a cooling fan housing defining a cooling air channel, the cooling fan housing operable to couple to an information handling system proximate to heat generating components;
    a cooling fan mount disposed in the cooling air channel and operable to support a cooling fan aligned to force air through the channel to cool heat generating components; and
    one or more cooling fan mount supports extending from the cooling fan housing across the cooing air channel to the cooling fan mount, each support having a dampening section operable to absorb vibrations created by cooling fan operation.

2. The information handling system cooling fan assembly of claim 1 wherein each cooling fan mount support dampening section comprises an elastomer operable to dampen vibrations.

3. The information handling system cooling fan assembly of claim 1 molded by two shot injection molding with the housing, cooling fan mount and cooling fan mount supports molded in a first shot with a substantially rigid plastic and the dampening section molded with a substantially elastic plastic, the two shot injection molding forming a single integrated part.

4. The information handling system cooling fan assembly of claim 1 further comprising a cooling fan coupled to the cooling fan mount and disposed in the cooling air channel.

5. The information handling system cooling fan assembly of claim 4 further comprising a cooling fan controller coupled between the cooling fan mount and the cooling fan.

6. The information handling system cooling fan assembly of claim 1 wherein the dampening section couples to the fan mount and the cooling fan mount support with one or more attachment devices.

7. The information handling system cooling fan assembly of claim 6 wherein the attachment devices comprise screws.

8. An information handling system comprising:
    a component housing operable to contain information handling system components;
    plural components disposed in the component housing to perform information handling functions, the components generating heat;
    a fan housing disposed in the component housing, the fan housing having a cooling channel aligned to direct cooling air flow through the component housing to cool the components;
    a fan mount disposed in the cooling channel;
    a fan coupled to the fan mount an operable to generate cooling air flow through the cooling channel; and
    fan mount supports connecting the fan mount to the fan housing, the fan mount supports integrated with the fan mount and fan housing and having a rigid portion and an elastic portion to dampen vibrations associated with the fan.

9. The information handling system of claim 8 wherein the fan mount support rigid portion comprises a rigid plastic and the fan mount support elastic portion comprises an elastic plastic.

10. The information handling system of claim 9 wherein the fan mount support is formed by two shot injection molding to comprises an integrated plastic support having the rigid and elastic plastics couple together.

11. The information handling system claim 8 wherein the fan housing, fan mount, and fan mount supports are formed as an integrated piece with a two shot injection molding process, a rigid plastic injection shot forming the fan housing, fan mount and fan mount support rigid portion and an elastic plastic injection shot forming the fan mount support elastic portion.

12. The information handling system of claim 8 further comprising a fan controller interfaced with the fan to control cooling air flow.

13. The information handling system of claim 12 wherein the fan controller is coupled to the fan mount.

* * * * *